(12) United States Patent
Sasaki et al.

(10) Patent No.: US 10,797,231 B2
(45) Date of Patent: *Oct. 6, 2020

(54) SPIN-ORBIT TORQUE TYPE MAGNETIZATION REVERSAL ELEMENT, MAGNETIC MEMORY, AND HIGH FREQUENCY MAGNETIC DEVICE

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/359,040

(22) Filed: Mar. 20, 2019

(65) Prior Publication Data
US 2019/0221733 A1 Jul. 18, 2019

Related U.S. Application Data

(62) Division of application No. 15/705,991, filed on Sep. 15, 2017, now Pat. No. 10,319,901.

(30) Foreign Application Priority Data

Oct. 27, 2016 (JP) .................. 2016-210534
Jul. 14, 2017 (JP) .................. 2017-138386

(51) Int. Cl.
*G11C 11/15* (2006.01)
*H01L 43/04* (2006.01)
(Continued)

(52) U.S. Cl.
CPC ............ *H01L 43/04* (2013.01); *G11C 11/161* (2013.01); *G11C 11/18* (2013.01); *H01L 43/02* (2013.01);
(Continued)

(58) Field of Classification Search
CPC ......... H01L 43/04; H01L 43/02; H01L 43/08; H01L 43/10; H01L 43/14; G11C 11/161; G11C 11/18
(Continued)

(56) References Cited

U.S. PATENT DOCUMENTS 6,765,823 B1   7/2004 Zhu et al.
7,274,080 B1   9/2007 Parkin
(Continued)

FOREIGN PATENT DOCUMENTS

JP   2011-138604 A   7/2011
JP   2014-207469 A   10/2014
WO  2016/021468 A1   2/2016

OTHER PUBLICATIONS

Aug. 27, 2018 Office Action issued in U.S. Appl. No. 15/705,991.
(Continued)

*Primary Examiner* — Huan Hoang
(74) *Attorney, Agent, or Firm* — Oliff PLC

(57) ABSTRACT

A spin-orbit torque type magnetization reversal element including a ferromagnetic metal layer with a varying magnetization direction; and spin-orbit torque wiring that extends in a first direction intersecting with a stacking direction of the ferromagnetic metal layer and that is joined to the ferromagnetic metal layer; wherein when viewed from the first direction, the spin-orbit torque wiring is asymmetrical in a second direction that is orthogonal to the first direction and the stacking direction, with respect to an axis that passes through a center, in the second direction, of the ferromagnetic metal layer.

21 Claims, 7 Drawing Sheets

(51) Int. Cl.
  *G11C 11/18* (2006.01)
  *H01L 43/02* (2006.01)
  *G11C 11/16* (2006.01)
  *H01L 43/08* (2006.01)
  *H01L 43/10* (2006.01)
  *H01L 43/14* (2006.01)

(52) U.S. Cl.
  CPC .............. *H01L 43/08* (2013.01); *H01L 43/10* (2013.01); *H01L 43/14* (2013.01)

(58) Field of Classification Search
  USPC .................................. 365/158, 171; 257/421
  See application file for complete search history.

(56) References Cited

U.S. PATENT DOCUMENTS

| | | | |
|---|---|---|---|
| 8,350,347 | B2 | 1/2013 | Gaudin et al. |
| 9,478,309 | B2 | 10/2016 | Nebashi et al. |
| 9,691,458 | B2 | 6/2017 | Ralph et al. |
| 10,319,901 | B2 * | 6/2019 | Sasaki .................. G11C 11/161 |
| 10,418,545 | B2 * | 9/2019 | Sasaki ..................... H01L 43/02 |
| 2002/0145902 | A1 | 10/2002 | Kunikiyo et al. |
| 2004/0089904 | A1 | 5/2004 | Bhattacharyya et al. |
| 2008/0151614 | A1 | 6/2008 | Guo |
| 2010/0073806 | A1 | 3/2010 | Koui et al. |
| 2010/0271870 | A1 | 10/2010 | Zheng et al. |
| 2011/0044099 | A1 | 2/2011 | Dieny |
| 2012/0267734 | A1 | 10/2012 | Sasaki et al. |
| 2012/0320666 | A1 | 12/2012 | Ohno et al. |
| 2013/0107395 | A1 | 5/2013 | Nagasawa et al. |
| 2014/0169088 | A1 | 6/2014 | Buhrman et al. |
| 2015/0129995 | A1 | 5/2015 | Wang et al. |
| 2015/0348606 | A1 | 12/2015 | Buhrman et al. |
| 2016/0247550 | A1 | 8/2016 | Fukami et al. |
| 2016/0315249 | A1 | 10/2016 | Kardasz et al. |
| 2017/0178705 | A1 | 6/2017 | Buhrman et al. |
| 2017/0222135 | A1 | 8/2017 | Fukami et al. |

OTHER PUBLICATIONS

Guoqiang Yu et al., "Current-Driven Perpendicular Magnetization Switching in Ta/CoFeB/[TaOx or MgOrTaOx] Films with Lateral Structural Asymmetry" Applied Physics Letters, vol. 105, pp. 102411-102411-5, (2014).
I. M. Miron et al., "Perpendicular Switching of a Single Ferromagnetic Layer Induced by In-Plane Current Injection", Nature, vol. 476, (2011), pp. 189-194.
Y. K. Kato et al., "Observation of the Spin Hall Effect in Semiconductors" Science, vol. 306, (2004), pp. 1910-1913.
L. Liu et al., "Spin Torque Switching With the Giant Spin Hall Effect of Tantalum", Science, vol. 336, (2012), pp. 555.
L. Liu et al., "Current-Induced Switching of Perpendicularly Magnetized Magnetic Layers Using Spin Torque From the Spin Hall Effect" Physical Review Letters, vol. 109, (2012), pp. 096602-1-0-096602-5.
KS. Lee et al., "Threshold Current for Switching of a Perpendicular Magnetic Layer Induced by Spin Hall Effect", Applied Physics Letters, vol. 102, (2013), pp. 112410.
KS. Lee et al., "Thermally Activated Switching of Perpendicular Magnet by Spin-Orbit Torque", Applied Physics Letters, vol. 104, (2014), pp. 072413-1-072413-5.
S. Fukami et al., "Magnetization Switching by Spin-Orbit Torque in an Antiferromagnet-Ferromagnet Bilayer System", Nature Materials, vol. 15, (2016), pp. 535-542.
S. Fukami et al., "A Spin-Orbit Torque Switching Scheme With Collinear Magnetic Easy Axis and Current Configuration", Nature Technology, vol. 11, (2016), pp. 621.
S. Takahashi et al., "Spin Injection and Detection in Magnetic Nanostructures",Physical Review B, vol. 67, (2003), pp. 052409-1-052409-4.
Y. Seo et al., "Area-Efficient SOT-MRAM With a Schottky Diode", IEEE Electron Device Letters, vol. 37, No. 8, (2016), pp. 982-985.
Yu, Guoqiang et al., "Switching of perpendicular magnetization by spin-orbit torques in the absence of external magnetic fields", Nature Nanotechnology, pp. 548-554, vol. 9, (2014).
U.S. Appl. No. 15/702,290, filed Sep. 12, 2017.
U.S. Appl. No. 15/642,003, filed Jul. 5, 2017.
Aug. 10, 2018 Office Action issued in U.S. Appl. No. 15/642,001.
Nov. 16, 2018 Office Action issued in U.S. Appl. No. 15/702,290.
Dec. 11, 2018 Office Action issued in U.S. Appl. No. 15/642,003.

* cited by examiner (a)

(b)

(c)

(a)

(b)

(c)

SPIN-ORBIT TORQUE TYPE MAGNETIZATION REVERSAL ELEMENT, MAGNETIC MEMORY, AND HIGH FREQUENCY MAGNETIC DEVICE

RELATED APPLICATIONS

This is a Divisional Application of application Ser. No. 15/705,991 filed Sep. 15, 2017, which in turn claims priority of Japanese Patent Application No. 2016-210534, filed Oct. 27, 2016, and Japanese Patent Application No. 2017-138386, filed Jul. 14, 2017, the contents of which are incorporated herein by reference.

BACKGROUND OF THE INVENTION

Field of Invention

The present invention relates to a spin-orbit torque type magnetoresistance reversal element, a magnetic memory, and high frequency magnetic device.

Description of Related Art

Examples of known magnetoresistance effect elements include giant magnetoresistance (GMR) elements composed of a multilayer film of ferromagnetic layers and non-magnetic layers, and tunnel magnetoresistance (TMR) elements which use insulating layers (tunnel barrier layers, barrier layers) for the non-magnetic layers. Generally, TMR elements have a larger element resistance than GMR elements, but the magnetoresistance (MR) ratio is larger than GMR elements. Consequently, TMR elements are attracting much attention as elements for magnetic sensors, high-frequency components, magnetic heads and non-volatile random access memory (MRAM).

MRAM reads and writes data by utilizing the characteristic that when the relative orientation between the magnetizations of two ferromagnetic layers that sandwich an insulating layer is changed, the element resistance of the TMR element changes. Examples of known methods for writing to MRAM include a method in which a magnetic field generated by an electric current is used to perform writing (magnetization reversal), and a method in which a spin transfer torque (STT) generated by passing an electric current through the stacking direction of a magnetoresistance effect element is used to perform writing (magnetization reversal).

Magnetization reversal of a TMR element using STT is efficient if considered form the viewpoint of energy efficiency, but the reversal current density required to achieve magnetization reversal is high. From the viewpoint of achieving a long life for the TMR element, this reversal current density is preferably low. This point is similar for GMR elements.

Accordingly, in recent years, much attention has been focused on magnetization reversal that utilizes pure spin current generated by spin-orbit interaction as a technique for reducing the reversal current (for example, see Patent Document 1). Pure spin current generated by spin-orbit interaction induces spin-orbit torque (SOT), with this SOT causing magnetization reversal. Further, pure spin current generated by the Rashba effect at the interface between different materials can also cause magnetization reversal by SOT in a similar manner. Details regarding the mechanisms of these processes are still not entirely clear. A pure spin current is generated when an electron with upward spin and an electron with downward spin flow with the same frequency in opposing directions, so that the electric charge flows cancel each other out. As a result, the electric current flowing in the magnetoresistance effect element is zero, meaning that using spin-orbit torque (SOT) is expected to lengthen the lifespan of the magnetoresistance effect element.

However, magnetization reversal making use of SOT is considered to require disrupting the symmetry of the magnetization that undergoes magnetization reversal (for example, see Patent Document 1 and Non-Patent Document 2). Methods for disrupting the magnetization symmetry include a method of applying an external magnetic field and a method of changing the intensity of the magnetic anisotropy in the in-plane direction of the magnetoresistance effect element.

RELATED LITERATURE

Patent Documents

Patent Document 1
US 2015/0129995 A

Non-Patent Documents

Non-Patent Document 1
I. M. Miron, K. Garello, G Gaudin, P.-J. Zermatten, M. V Costache, S. Auffret, S. Bandiera, B. Rodmacq, A. Schuhl, and P. Gambardella, Nature, 476, 189 (2011). Non-Patent Document 2
Guoqiang Yu, et al., Nature Nanotechnology, DOI:10.1038/NNANO.2014.94.

BRIEF SUMMARY OF THE INVENTION

However, a magnetic field generation source is necessary in order to apply an external magnetic field. Providing a separate magnetic field generation source will lead to a reduced level of integration in an integrated circuit containing the spin-orbit torque type magnetization reversal elements.

Additionally, Non-Patent Document 2 describes changing the oxygen concentration in the in-plane direction of oxide films, which are non-magnetic layers. However, the method described in Non-Patent Document 2 requires non-magnetic layers comprising oxide films, and cannot be used in applications other than TMR elements. For this reason, the method has little potential for general use, and cannot be used in GMR elements or in magneto-optic devices that make use of the Kerr effect or the Faraday effect.

Further, as described in Non-Patent Document 2, if the strength of the magnetic anisotropy within the in-plane direction of the magnetoresistance effect element differs, then when an unintentional external force (such as an external magnetic field or heat) is applied, the magnetization of portions having less magnetic anisotropy may sometimes reverse. Unintentional magnetization reversal becomes data noise, which can impair the long-term storage of data. Particularly in those cases where the size of the ferromagnetic material of the magnetoresistance effect element is a size capable of forming a magnetic domain wall, there is a possibility that magnetization reversal of those portions having less magnetic anisotropy may induce magnetization reversal of other portions, leading to the overwriting of data.

The present invention was made in view of the above-mentioned problems, and has the purpose of providing a spin-orbit torque type magnetization reversal element that can easily perform magnetization reversal.

The present inventors discovered that a spin-orbit torque type magnetization reversal element that can easily perform magnetization reversal can be provided by making the intensity of the spin injected from spin-orbit torque wiring asymmetrical.

In other words, the present invention provides the following means for solving the above-mentioned problem.

(1) A spin-orbit torque type magnetization reversal element according to a first embodiment comprises a ferromagnetic metal layer with a varying magnetization direction; and spin-orbit torque wiring that extends in a first direction intersecting with a stacking direction of the ferromagnetic metal layer and that is joined to the ferromagnetic metal layer; wherein, when viewed from the first direction, the spin-orbit torque wiring is asymmetrical in a second direction that is orthogonal to the first direction and the stacking direction, with respect to an axis that passes through a center, in the second direction, of the ferromagnetic metal layer.

(2) In the spin-orbit torque type magnetization reversal element according to the above-mentioned embodiment, when end portions of the spin-orbit torque wiring in the second direction are defined as a first end portion and a second end portion; and of the end portions of the ferromagnetic metal layer in the second direction, the end portion on the side closer to the first end portion is defined as a third end portion and the end portion on the side closer to the second end portion is defined as a fourth end portion; a distance between the first end portion and the third end portion may be different from a distance between the second end portion and the fourth end portion.

(3) In the spin-orbit torque type magnetization reversal element according to the above-mentioned embodiment, the distance between the first end portion and the third end portion and the distance between the second end portion and the fourth end portion may both be greater than zero, and at least one of the distances may be not more than a spin diffusion length of the spin-orbit torque wiring.

(4) In a spin-orbit torque type magnetization reversal element according to a second embodiment, when the spin-orbit torque wiring is viewed from the first direction, an area of a first region lying on a side towards a first end portion in the second direction, with respect to the axis, may be different from an area of a second region lying on a side towards a second end portion.

(5) In a spin-orbit torque type magnetization reversal element according to a third embodiment, in the spin-orbit torque wiring, a material constituting a first part on a side towards a first end portion in the second direction, with respect to the axis, may be different from a material constituting a second part lying on a side towards a second end portion.

(6) In a spin-orbit torque type magnetization reversal element according to the above-mentioned embodiment, the first part may comprise a metal, and the second part may comprise a semiconductor or an insulator.

(7) In a spin-orbit torque type magnetization reversal element according to a fourth embodiment, the spin-orbit torque wiring may be inclined in the second direction when viewed from the first direction.

(8) A spin-orbit torque type magnetization reversal element according to the above-mentioned embodiment may further comprise a non-magnetic layer and a fixed layer with a fixed magnetization direction, on a surface on a side of the ferromagnetic metal layer opposite to the spin-orbit torque wiring.

(9) A magnetic memory according to an embodiment of the present invention uses a spin-orbit torque type magnetization reversal element according to an above-mentioned embodiment.

(10) A high-frequency magnetic device according to an embodiment of the present invention uses a spin-orbit torque type magnetization reversal element according to an above-mentioned embodiment.

According to the spin-orbit torque type magnetization reversal element of the above-mentioned embodiment, the orientation of the magnetization of the ferromagnetic layer can be easily reversed.

DETAILED DESCRIPTION OF THE INVENTION

The present invention is described below in further detail, with reference to the drawings. The drawings used in the following description may be drawn with specific portions enlarged as appropriate to facilitate comprehension of the features of the present invention, and the dimensional ratios and the like between the constituent elements may differ from the actual values. Further, the materials and dimensions and the like presented in the following examples are merely examples, which in no way limit the present invention, and may be altered as appropriate within the scope of the present invention.

First Embodiment (Spin-Orbit Torque Type Magnetization Reversal Element)

Figure 1:
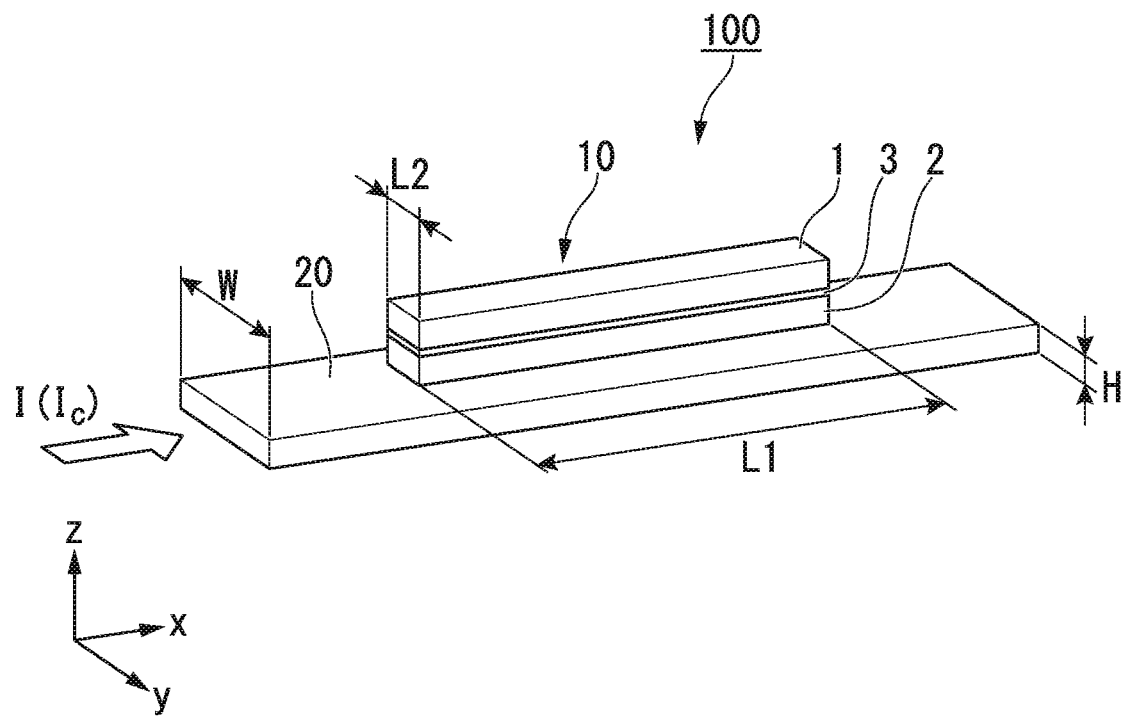
FIG. 1 is a perspective view schematically illustrating a spin-orbit torque type magnetization reversal element according to a first embodiment.

FIG. 1 is a perspective view schematically illustrating a spin-orbit torque type magnetization reversal element according to a first embodiment.

The spin-orbit torque type magnetization reversal element 100 according to the first embodiment has a magnetoresistance effect element 10 and spin-orbit torque wiring 20.

In the following description, the stacking direction of the magnetoresistance effect element 10 is deemed the z-direction, a first direction along which the spin-orbit torque wiring 20 extends is deemed the x-direction, a second direction which is orthogonal to both the x-direction and the z-direction is deemed the y-direction.

<Magnetoresistance Effect Element>

The magnetoresistance effect element 10 has a first ferromagnetic metal layer 1 having a fixed magnetization direction, a second ferromagnetic metal layer 2 having a variable magnetization direction, and a non-magnetic layer 3 sandwiched between the first ferromagnetic metal layer 1 and the second ferromagnetic metal layer 2.

The magnetoresistance effect element 10 functions by having the orientation of the magnetization M1 of the first ferromagnetic metal layer 1 fixed in a single direction, whereas the orientation of the magnetization M2 of the second ferromagnetic metal layer 2 is able to vary relatively. When applied to coercive force difference (pseudo spin valve) MRAM, the coercive force of the first ferromagnetic metal layer is larger than the coercive force of the second ferromagnetic metal layer, and when applied to exchange bias (spin valve) MRAM, the magnetization direction of the first ferromagnetic metal layer is fixed by exchange coupling with an antiferromagnetic layer.

When the non-magnetic layer 3 is formed from an insulator, the magnetoresistance effect element 10 is a tunneling magnetoresistance (TMR) element, whereas when the non-magnetic layer 3 is formed from a metal, the magnetoresistance effect element 10 is a giant magnetoresistance (GMR) element.

The stacking structure of the magnetoresistance effect element can employ a conventional magnetoresistance effect element stacking structure. For example, each layer may be composed of a plurality of layers, and the structure may also include other layers such as an antiferromagnetic layer for fixing the magnetization direction of the first ferromagnetic metal layer 1. The first ferromagnetic metal layer 1 is also called the fixed layer or reference layer, whereas the second ferromagnetic metal layer 2 is also called the free layer or the memory layer.

Conventional materials can be used as the material for the first ferromagnetic metal layer 1. For example, metals selected from the group consisting of Cr, Mn, Co, Fe and Ni, and alloys containing at least one of these metals and having ferromagnetism can be used. Further, alloys containing at least one of these metals and at least one element among B, C and N can also be used. Specific examples include Co—Fe and Co—Fe—B.

Further, in order to achieve higher output, a Heusler alloy such as $Co_2FeSi$ is preferably used. Heusler alloys contain intermetallic compounds having a chemical composition of $X_2YZ$, wherein X is a noble metal element or a transition metal element belonging to the Co, Fe, Ni or Cu group of the periodic table, whereas Y is a transition metal belonging to the Mn, V, Cr or Ti group of the periodic table, and can select the elemental species of X, and Z is a typical element of group III to group V. Specific examples include $Co_2FeSi$, $Co_2MnSi$, and $Co_2Mn_{1-a}Fe_aAl_bSi_{1-b}$.

Furthermore, in order to increase the coercive force of the first ferromagnetic metal layer 1 on the second ferromagnetic metal layer 2, an antiferromagnetic material such as IrMn or PtMn may be used as the material that contacts the first ferromagnetic metal layer 1. Moreover, in order to ensure that the leakage magnetic field of the first ferromagnetic metal layer 1 does not affect the second ferromagnetic metal layer 2, a structure having synthetic ferromagnetic coupling may be used.

Furthermore, in those cases where the orientation of the magnetization of the first ferromagnetic metal layer 1 is perpendicular to the stacking surface, a stacked film of Co and Pt is preferably used. Specifically, the structure of the first ferromagnetic metal layer 1 may be [FeB (1.0 nm)/Ta (0.2 nm)/[Pt (0.16 nm)/Co (0.16 nm)]$_4$/Ru (0.9 nm)/Co (0.24 nm)/Pt (0.16 nm)]$_6$ in order from the non-magnetic layer 3.

For the material of the second ferromagnetic metal layer 2, a ferromagnetic material, and particularly a soft magnetic material, can be used. Examples of materials that can be used include metals selected from the group consisting of Cr, Mn, Co, Fe and Ni, alloys containing at least one of these metals, and alloys containing at least one of these metals and at least one element among B, C and N. Specific examples include Co—Fe, Co—Fe—B and Ni—Fe.

In those cases where the orientation of the magnetization of the second ferromagnetic metal layer 2 is perpendicular to the stacking surface, the thickness of the second ferromagnetic metal layer 2 is preferably not more than 2.5 nm. Perpendicular magnetic anisotropy can be applied to the second ferromagnetic metal layer 2 at the interface between the second ferromagnetic metal layer 2 and the non-magnetic layer 3. Further, because the perpendicular magnetic anisotropy effect is attenuated as the thickness of the second ferromagnetic metal layer 2 is increased, the thickness of the second ferromagnetic metal layer 2 is preferably kept thin.

Conventional materials can be used as the non-magnetic layer 3.

For example, when the non-magnetic layer 3 is formed from an insulator (and forms a tunnel barrier layer), examples of materials that can be used include $Al_2O_3$, $SiO_2$, MgO and $MgAl_2O_4$. In addition to these materials, materials in which a portion of the Al, Si or Mg has been substituted with Zn or Be or the like can also be used. Among the above materials, MgO and $MgAl_2O_4$ are materials that enable the realization of coherent tunneling, and therefore enable efficient injection of spin.

Further, when the non-magnetic layer 3 is formed from a metal, examples of materials that can be used include Cu, Au, and Ag and the like.

Furthermore, the magnetoresistance effect element 10 may also have other layers. For example, the magnetoresistance effect element 10 may have a base layer on the opposite surface of the second ferromagnetic metal layer 2 from the non-magnetic layer 3, and/or may have a capping layer on the opposite surface of the first ferromagnetic metal layer 1 from the non-magnetic layer 3.

A layer disposed between the spin-orbit torque wiring 20 and the magnetoresistance effect element 10 preferably does not dissipate the spin propagated from the spin-orbit torque wiring 20. For example, silver, copper, magnesium, and aluminum and the like have a long spin diffusion length of at least 100 nm, and are known to be resistant to spin dissipation.

The thickness of this layer is preferably not more than the spin diffusion length of the material used for forming the layer. Provided the thickness of the layer is not more than the spin diffusion length, the spin propagated from the spin-orbit torque wiring 20 can be transmitted satisfactorily to the magnetoresistance effect element 10.

<Spin-Orbit Torque Wiring>

The spin-orbit torque wiring 20 extends along the x-direction. The spin-orbit torque wiring 20 is connected to one surface of the second ferromagnetic metal layer 2 in the z-direction. The spin-orbit torque wiring 20 may be connected directly to the second ferromagnetic metal layer 2, or connected via another layer.

The spin-orbit torque wiring 20 is formed from a material that generates a pure spin current by the spin Hall effect when a current flows through the material. This material may have any composition capable of generating a pure spin current in the spin-orbit torque wiring 20. Accordingly, the material is not limited to materials formed from simple elements, and may also be composed of a portion formed from a material that generates a pure spin current and a portion formed from a material that does not generate a pure spin current.

The spin Hall effect is a phenomenon wherein when an electric current is passed through a material, a pure spin current is induced in a direction orthogonal to the orientation of the electric current as a result of spin-orbit interactions.

Figure 2:
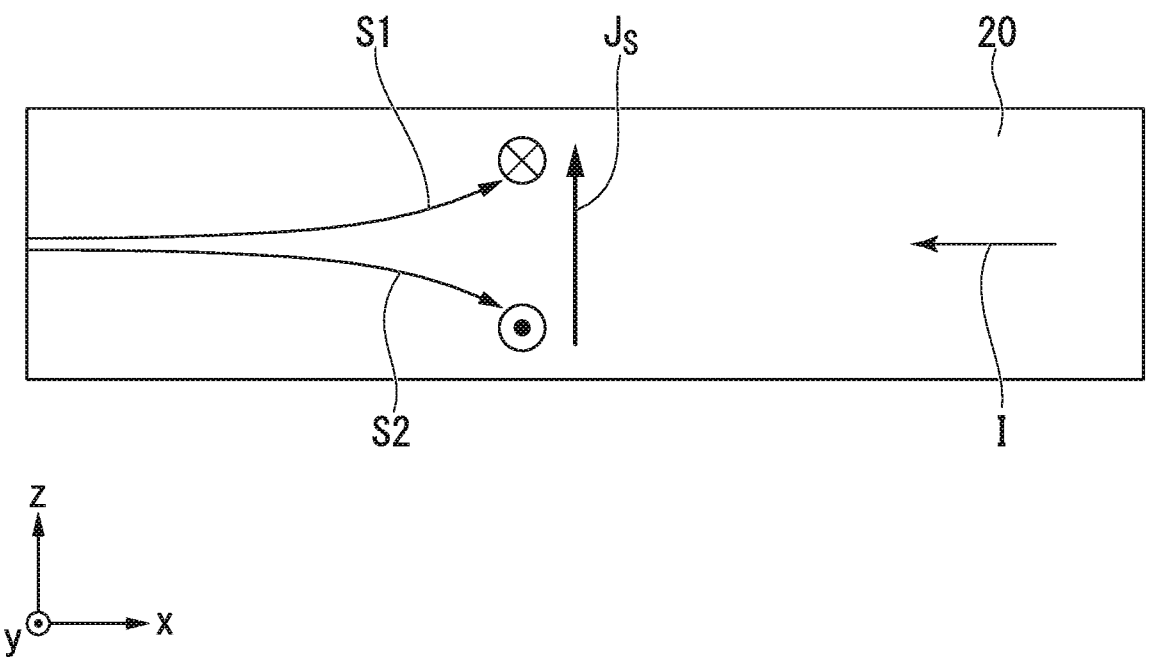
FIG. 2 is a schematic view for explaining the spin Hall effect.

FIG. 2 is a schematic diagram for explaining the spin Hall effect. FIG. 2 is a cross-sectional view of the spin orbit torque wiring 20 shown in FIG. 1 cut along the x-direction. A mechanism by which a pure spin current is generated by the spin Hall effect is described with reference to FIG. 2.

As illustrated in FIG. 2, when an electric current I flows along the direction which the spin-orbit torque wiring 20 extends, a first spin S1 oriented toward the back of the paper surface and a second spin S2 oriented toward the front of the paper surface are bent in directions orthogonal to the current. The normal Hall effect and the spin Hall effect have in common the fact that the direction of travel (movement) of the traveling (moving) electric charge (electrons) is bent, but differ significantly in terms of the fact that in the common Hall effect, charged particles moving through a magnetic field are affected by Lorentz forces, resulting in bending of the travel direction, whereas in the spin Hall effect, despite no magnetic field existing, the travel direction of the spin bends simply under the effect of the movement of the electrons (flow of current).

In a non-magnetic material (a material that is not ferromagnetic), the electron count of the first spin S1 and the electron count of the second spin S2 are equal, and therefore in FIG. 2, the electron count of the first spin S1 moved to the upward direction and the electron count of the second spin S2 moved to the downward direction are equal. Accordingly, the electric current represented by the net flux of the electric charge is zero. This type of spin current that is accompanied by no electric current is called a pure spin current.

When a current is passed through a ferromagnetic material, the fact that the first spin S1 and the second spin S2 are bent in opposite directions is the same. However, the difference in a ferromagnetic material is that one of either the first spin S1 or the second spin S2 is greater, resulting in the occurrence of a net flux for the electric charge (and the generation of a voltage). Accordingly, a material formed solely from a ferromagnetic substance cannot be used as the material for the spin-orbit torque wiring 20.

If the electron flow of the first spin S1 is represented by $J_\uparrow$, the electron flow of the second spin S2 is represented by $J_\downarrow$, and the spin current is represented by $J_S$, then the spin current is defined as $J_S = J_\uparrow - J_\downarrow$. In FIG. 2, the pure spin current $J_S$ flows in the upward direction in the figure. Here, $J_S$ is an electron flow having 100% polarizability.

In FIG. 1, when a ferromagnetic material is brought into contact with the upper surface of the spin-orbit torque wiring 20, the pure spin current diffuses and flows into the ferromagnetic material. In other words, spin is injected into the magnetoresistance effect element 10.

The spin-orbit torque wiring 20 may contain a non-magnetic heavy metal. Here, the term "heavy metal" is used to mean a metal having a specific gravity at least as large as that of yttrium. The spin-orbit torque wiring 20 may also be formed solely from a non-magnetic metal.

In such a case, the non-magnetic metal is preferably a non-magnetic metal with a large atomic number, and specifically a non-magnetic metal with an atomic number of 39 or greater having d-electrons or f-electrons in the outermost shell. The reason for this preference is that such non-magnetic metals exhibit large spin-orbit interactions that generate a spin Hall effect. The spin-orbit torque wiring 20 may also be formed solely from a non-magnetic metal with a large atomic number, having an atomic number of 39 or greater and having d-electrons or f-electrons in the outermost shell.

Typically, when a current is passed through a metal, all of the electrons move in the opposite direction of the current regardless of spin orientation, but in the case of a non-magnetic metal with a large atomic number having d-electrons or f-electrons in the outermost shell, because the spin-orbit interactions are large, the spin Hall effect greatly acts and the direction of electron movement is dependent on the electron spin orientation, meaning a pure spin current $J_S$ develops more readily.

Furthermore, the spin-orbit torque wiring 20 may contain a magnetic metal. The term "magnetic metal" means a ferromagnetic metal or an antiferromagnetic metal. By including a trace amount of a magnetic metal in the non-magnetic metal, the spin-orbit interactions can be amplified, thereby increasing the spin current generation efficiency of the electric current passed through the spin-orbit torque wiring 20. The spin-orbit torque wiring 20 may also be formed solely from an antiferromagnetic metal.

Spin-orbit interactions occur within interior field peculiar to the substance of the spin-orbit torque wiring material. Accordingly, pure spin currents also develop in non-magnetic materials. By adding a trace amount of a magnetic metal to the spin-orbit torque wiring material, because the electron spin of the magnetic metal itself is scattered, the efficiency of spin current generation is enhanced. However, if the amount added of the magnetic metal is too large, then the generated pure spin current tends to be scattered by the added magnetic metal, resulting in a stronger action reducing the spin current. Accordingly, it is preferable that the molar ratio of the added magnetic metal is considerably lower than that of the main component of the pure spin current generation portion in the spin-orbit torque wiring. As a guide, the molar ratio of the added magnetic metal is preferably not more than 3%.

Furthermore, the spin-orbit torque wiring 20 may contain a topological insulator. The spin-orbit torque wiring 20 may also be formed solely from a topological insulator. A topological insulator is a substance in which the interior of the substance is an insulator or a high-resistance body, but the surface of the substance forms a metal-like state with spin polarization. This substances have a type of internal magnetic field known as a spin-orbit interaction. Accordingly, even if an external magnetic field does not exist, the effect of these spin-orbit interactions generates a new topological phase. This is a topological insulator, which as a result of strong spin-orbit interactions and the break of inversion symmetry at the edges, is able to generate a pure spin current with good efficiency.

Examples of preferred topological insulators include SnTe, $Bi_{1.5}Sb_{0.5}Te_{1.7}Se_{1.3}$, $TlBiSe_2$, $Bi_2Te_3$, and $(Bi_{1-x}Sb_x)_2Te_3$. These topological insulators can generate spin current with good efficiency.

The spin-orbit torque type magnetoresistance effect element 100 may also have other structural elements besides the magnetoresistance effect element 10 and the spin-orbit torque wiring 20. For example, the spin-orbit torque type magnetoresistance effect element 100 may have a substrate or the like as a support. The substrate preferably has superior smoothness, and examples of materials that can be used include Si and AlTiC.

(Relationship Between Magnetoresistance Effect Element and Spin-Orbit Torque Wiring)

Figure 3:
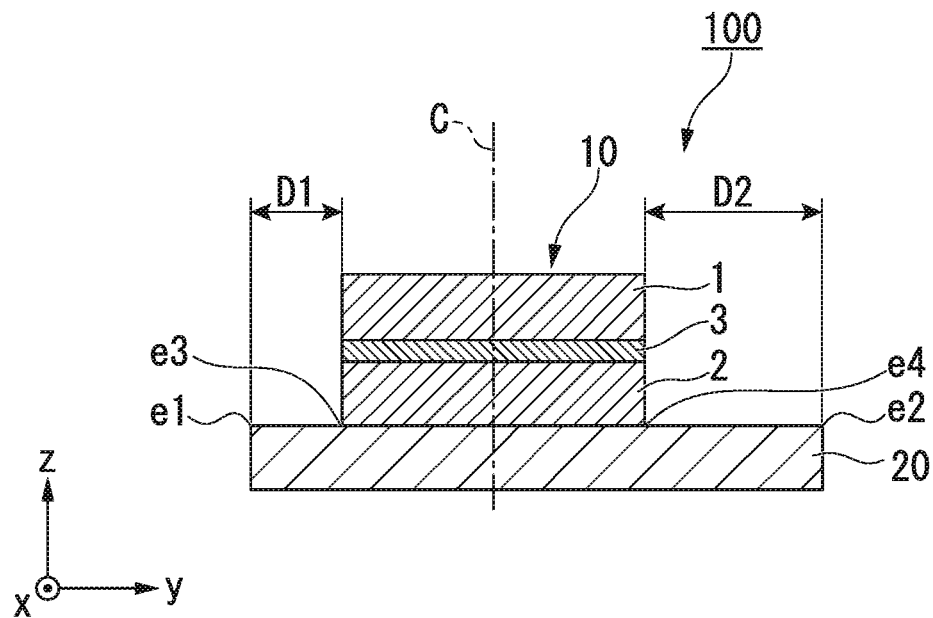
FIG. 3 is a section view of the spin-orbit torque type magnetization reversal element according to the first embodiment, when cut along the y-direction.

FIG. 3 is a section view of the spin-orbit torque type magnetization reversal element 100 according to the first embodiment, when cut along the y-direction. As shown in FIG. 3, the spin-orbit torque wiring 20 is asymmetrical, in the y-direction, with respect to an axis C that passes through center of the second ferromagnetic metal layer 2 in the y-direction. In this case, the "center of the second ferromagnetic metal layer 2 in the y-direction" refers to the center, in the y-direction, of the surface of the second ferromagnetic metal layer 2 on the side towards the spin-orbit torque wiring 20, and "axis" refers to a straight line extending in the z-direction through said center.

As illustrated in FIG. 3, in the spin-orbit torque type magnetic reversal element 100 according to the first embodiment, the distance, in the y-direction, from one end of the spin-orbit torque wiring 20 to the axis is different from the distance from the other end to the axis. In other words, the following relationship is established.

The two end portions of the spin-orbit torque wiring 20 in the y-direction are referred to as a first end portion e1 and a second end portion e2. Additionally, the two end portions of the magnetoresistance effect element 10 in the y-direction are referred to as a third end portion e3 and a fourth end portion e4. The third end portion e3 is the end portion on the same side as the first end portion e1, and the fourth end portion e4 is the end portion on the same side as the second end portion e2. The distance D1 between the first end portion e1 and the third end portion e3 differs from the distance D2 between the second end portion e2 and the fourth end portion e4.

The total amount of spin generated between the second end portion e2 and the fourth end portion e4 is greater than the total amount of spin generated between the first end portion e1 and the third end portion e3. When the spin generated at both ends is supplied to the magnetoresistance effect element 10, the spin current that is supplied from the fourth end portion e4 of the magnetoresistance effect element 10 is stronger than that supplied from the third end portion e3. In other words, the y-direction symmetry in the intensity of the spin current injected into the second ferromagnetic metal layer 2 is disrupted.

If the y-direction symmetry in the intensity of the spin current injected into the second ferromagnetic metal layer 2 is disrupted, then it is possible to trigger a reversal in the magnetization of the second ferromagnetic metal layer 2, and magnetization reversal is made easier. As a result thereof, magnetization reversal is possible even in the absence of a magnetic field. The reason for this will be explained below.

As illustrated in FIG. 1, when a current I is applied to the spin-orbit torque wiring 20, a pure spin current Js is generated in the z-direction. A magnetoresistance effect element 10 is provided in the z-direction of the spin-orbit torque wiring 20. Due thereto, spin is injected from the spin-orbit torque wiring 20 into the second ferromagnetic metal layer 2 of the magnetoresistance effect element 10. The injected spin applies a spin-orbit torque (SOT) to the magnetization of the second ferromagnetic metal layer 2, causing magnetization reversal.

In the spin-orbit torque type magnetization reversal element 100 illustrated in FIG. 1, the spin injected from the spin-orbit torque wiring 20 into the magnetoresistance effect element 10 is oriented along the y-direction. For this reason, unless the orientation of the magnetization of the second ferromagnetic metal layer 2 has in the y-direction, the orientation of the injected spin and the orientation of the magnetization of the second ferromagnetic metal layer will be orthogonal, and theoretically, the magnetization will not be affected by the injected spin.

There are two patterns to the magnetization of the second ferromagnetic metal layer 2, i.e., an in-plane orientation that is oriented in the x-y plane and a vertical orientation that is oriented in the z-direction perpendicular to the x-y plane. In recent years, there have been advances in the downsizing of magnetoresistance effect elements 10, and vertical orientations that are oriented in the z-direction have become common. Additionally, even in the case of an in-plane orientation, operations such as providing the second ferromagnetic metal layer 2 with shape anisotropy are necessary in order to fix the direction of magnetization of the second ferromagnetic metal layer 2 in the y-direction.

For this reason, stable magnetization reversal must be made possible whether the magnetization of the second ferromagnetic metal layer 2 is oriented in the z-direction or in the x-direction. In order to perform stable magnetization reversal whether the magnetization of the second ferromagnetic metal layer 2 is oriented in the z-direction or in the x-direction, it is necessary to provide a trigger for magnetization reversal at the initial stages of magnetization reversal.

Disruptions in the y-direction symmetry in the intensity of the spin current supplied to the second ferromagnetic metal layer 2 result in differences in the intensity of the SOT generated by the spin current in the y-direction. This difference in the intensity of the SOT in the y-direction serves as a trigger for magnetization reversal.

The magnetization of the second ferromagnetic metal layer 2 reverses while undergoing precession. Precession in the magnetization is amplified under the influence of SOT, and ultimately causes magnetization reversal. In other words, if it is possible to provide a trigger for precession of magnetization, then the magnetization can be thereafter reversed with the aid of precession. In other words, the key to magnetization reversal is to provide a trigger for precession of the magnetization.

In the spin-orbit torque type magnetization reversal element 100 according to the first embodiment, the shape of the spin-orbit torque wiring 20 is asymmetrical, in the y-direction, with respect to the axis C. For this reason, the y-direction symmetry in the intensity of the spin current injected into the second ferromagnetic metal layer 2 is disrupted, and a trigger for magnetization reversal of the magnetization of the second ferromagnetic metal layer 2 can be provided. As a result thereof, the magnetization of the second ferromagnetic metal layer 2 can be easily reversed.

This trigger for magnetization reversal was conventionally achieved by application of an external magnetic field. In contrast therewith, the spin-orbit torque type magnetization reversal element 100 according to the first embodiment provides a trigger by disrupting the y-direction symmetry in the intensity of the injected spin current. That is, magnetization reversal is possible even in the absence of a magnetic field.

The distance D1 between the first end portion e1 and the third end portion e3 and the distance D2 between the second end portion e2 and the fourth end portion e4 are both greater than zero, and preferably, at least one of the distances is not more than the spin diffusion length of the spin-orbit torque wiring 20.

When an electric current is supplied to the spin-orbit torque wiring 20, a pure spin current is generated between the first end portion e1 and the third end portion e3 and between the second end portion e2 and the fourth end portion e4. The spin that is generated in these regions can propagate within a distance range that is not more than the spin diffusion length. For this reason, if the distance D1 between the first end portion e1 and the third end portion e3 and the distance D2 between the second end portion e2 and the fourth end portion e4 are greater than zero, then the spin generated in these regions can also be used for magnetization rotation. Additionally, if these distances are not more than the spin diffusion length of the spin-orbit torque wiring 20, then the generated spin can all be used for magnetization reversal.

Additionally, the length L1 of the magnetoresistance effect element 10 in the x-direction is preferably greater than the length (width) L2 in the y-direction. The magnetization reversal of a magnetoresistance effect element 10 using SOT depends on the amount of injected spin. The amount of spin is determined by the current density $I_c$ of the electric current I flowing through the spin-orbit torque wiring 20.

The current density $I_c$ of the electric current I flowing through the spin-orbit torque wiring 20 is the value of the electric current flowing through the spin-orbit torque wiring 20 divided by the area of a plane orthogonal to the direction of flow of the electric current. For this reason, in FIG. 1, the current density $I_c=I/WH$. In this case, W represents the length (width) of the spin-orbit torque wiring 20 in the y-direction, and H represents the thickness of the spin-orbit torque wiring 20 in the z-direction.

In this case, in order to reduce the current amount flowing in the spin-orbit torque wiring 20, it is necessary to reduce the width W of the spin-orbit torque wiring 20 in the y-direction or the thickness H of the spin-orbit torque wiring 20 in the z-direction.

The width W of the spin-orbit torque wiring 20 must be greater than the length (width) L2 of the magnetoresistance effect element 10 in the y-direction. For this reason, in order to make the width W of the spin-orbit torque wiring 20 shorter, it is preferable for the length (width) L2 of the magnetoresistance effect element 10 in the y-direction to be shorter.

On the other hand, if the cross-sectional area of the magnetoresistance effect element 10 is small, then there is an increased probability that the magnetization of the second ferromagnetic metal layer 2 will be reversed under the influence of thermal disturbances or the like. For this reason, the area of the magnetoresistance effect element 10 must be at least a certain size in order to stably maintain magnetization.

Since there are no particular limits on the length L1 of the magnetoresistance effect element 10 in the x-direction, by making the length L1 in the x-direction longer than the length (width) L2 in the y-direction, it is possible to secure sufficient area for the magnetoresistance effect element 10 while keeping the length (width) L2 of the magnetoresistance effect element 10 in the y-direction short. Additionally, by making the length (width) L2 of the magnetoresistance effect element 10 short in the y-direction, the width W of the spin-orbit torque wiring 20 can be made relatively shorter, and the amount of current necessary for driving the spin-orbit torque type magnetization reversal element 100 can be reduced.

If the length L1 of the magnetoresistance effect element 10 in the x-direction is longer than the length (width) L2 in the y-direction, the magnetization of the second ferromagnetic metal layer 2 can be more easily oriented in the x-direction in the case of an in-plane orientation. This is because the length L1 in the x-direction and the length (width) L2 in the y-direction are different, creating a distribution in the demagnetizing field.

As mentioned above, for magnetization oriented in the x-direction, the direction of magnetization is orthogonal to the direction of the injected spin, so the magnetization should theoretically be unaffected by the injected spin. However, according to the spin-orbit torque type magnetization reversal element 100 of the present embodiment, magnetization reversal can be easily performed even if the magnetization of the second ferromagnetic metal layer 2 is oriented in the x-direction. For this reason, it is not necessary to consider the state of orientation of the magnetization of the second ferromagnetic metal layer 2, and the shape of the magnetoresistance effect element 10 can be freely set.

This spin-orbit torque type magnetization reversal element 100 can be used in a magnetic memory device, a high-frequency magnetic device, or the like.

Additionally, the spin-orbit torque type magnetization reversal element 100 can also be used as a magneto-optic element making use of the Kerr effect or the Faraday effect.

In this case, the magnetoresistance effect element 10 is not always necessary, and the structure may have just a ferromagnetic metal layer formed on the spin-orbit torque wiring 20.

Figure 4:
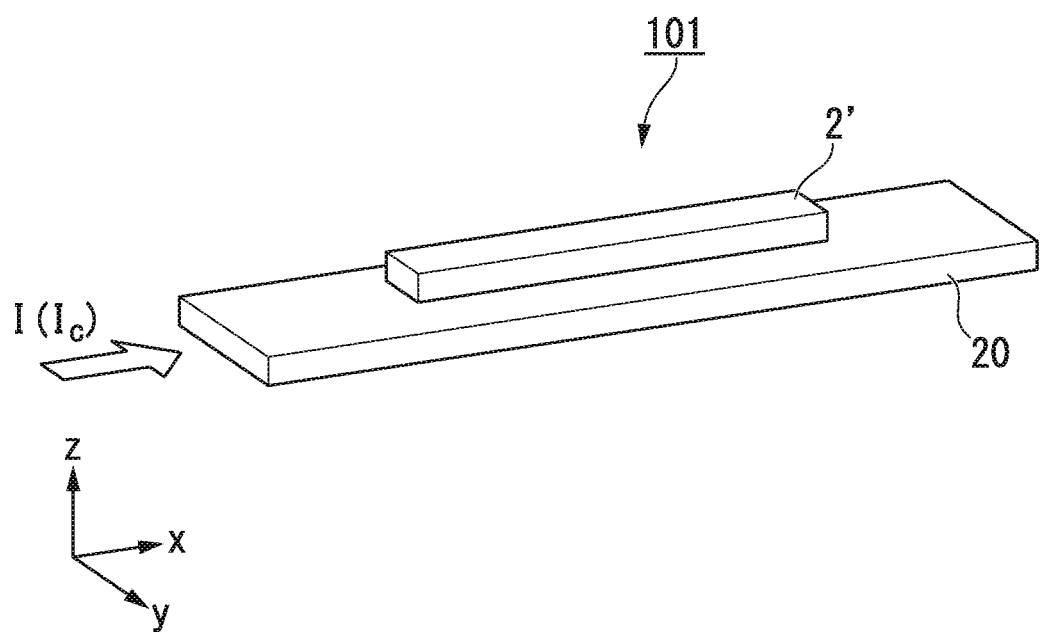
FIG. 4 is a perspective view schematically illustrating a different example of the spin-orbit torque type magnetization reversal element according to the first embodiment.

FIG. 4 is a diagram schematically illustrating a different example of the spin-orbit torque type magnetization reversal element according to the first embodiment. The spin-orbit torque type magnetization reversal element 101 illustrated in FIG. 4 has a ferromagnetic metal layer 2' with a varying magnetization direction, and spin-orbit torque wiring 20.

The ferromagnetic metal layer 2' of the spin-orbit torque type magnetization reversal element 101 is also capable of magnetization reversal even in the absence of a magnetic field. For this reason, it can be used as a magneto-optic element making use of the Kerr effect or the Faraday effect.

As mentioned above, in the spin-orbit torque type magnetization reversal element according to the present embodiment, the position of the spin-orbit torque wiring is shifted in the y-direction with respect to the axis of the magnetoresistance effect element. For this reason, it is possible to disrupt the y-direction symmetry in the intensity of the supplied spin current, and to create a trigger for causing magnetization reversal. As a result thereof, the magnetization can be easily reversed, and magnetization reversal can be performed even in the absence of a magnetic field.

Second Embodiment

Figure 5:
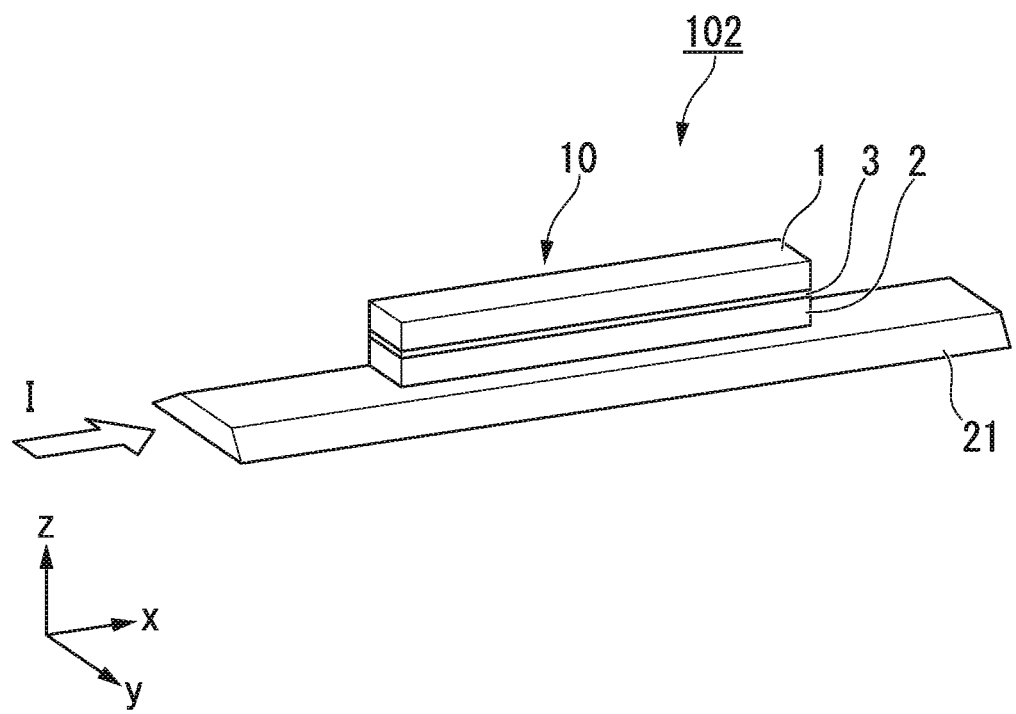
FIG. 5 is a perspective view schematically illustrating a spin-orbit torque type magnetization reversal element according to a second embodiment.

FIG. 5 is a perspective view schematically illustrating a spin-orbit torque type magnetization reversal element 102 according to a second embodiment. In the spin-orbit torque type magnetization reversal element 102 illustrated in FIG. 5, the shape of the spin-orbit torque wiring 21 is different from that in the spin-orbit torque type magnetization reversal element 100 according to the first embodiment. The remaining features are identical to those in the spin-orbit torque type magnetization reversal element 100 according to the first embodiment, and the same features are denoted by the same reference signs.

Figure 6:
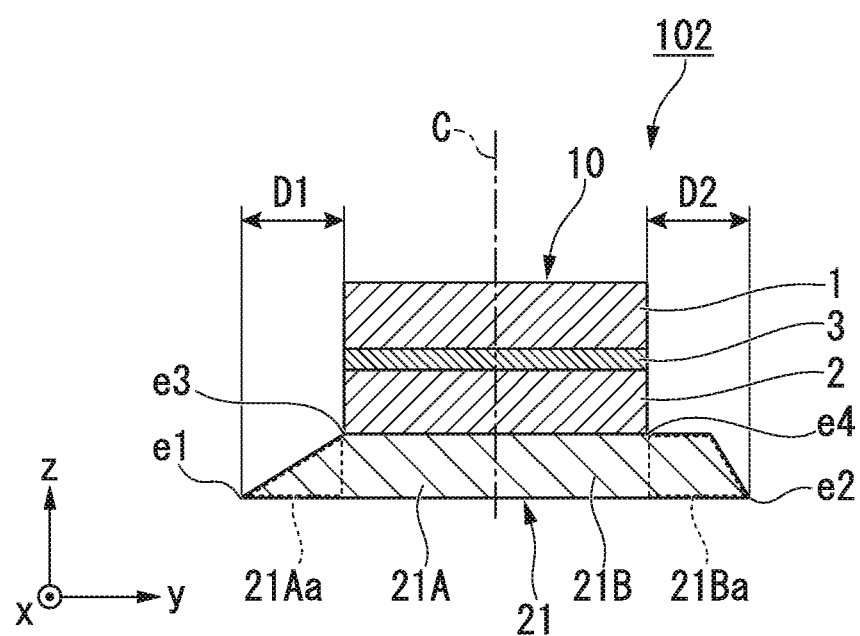
FIG. 6 is a section view of the spin-orbit torque type magnetization reversal element according to the second embodiment, when cut along the y-direction.

FIG. 6 is a schematic section view of the spin-orbit torque type magnetization reversal element 102 according to the second embodiment, when cut along the y-direction. In the spin-orbit torque type magnetization reversal element 102 illustrated in FIG. 6, the distance D1 between the first end portion e1 and the third end portion e3 is equal to the distance D2 between the second end portion e2 and the fourth end portion e4.

On the other hand, as illustrated in FIG. 6, in the spin-orbit torque type magnetization reversal element 102 according to the second embodiment, the area of a first region 21A on the side towards the first end portion e1, in the y-direction, with respect to the axis C, is different from the area of the second region 21B on the side towards the second end portion e2.

The total amount of spin generated between the second end portion e2 and the fourth end portion e4 is greater than the total amount of spin generated between the first end portion e1 and the third end portion e3. When the spin generated at both ends is supplied to the magnetoresistance effect element 10, the spin current that is supplied from the fourth end portion e4 of the magnetoresistance effect element 10 is stronger than that supplied from the third end portion e3. In other words, the y-direction symmetry in the intensity of the spin current injected into the second ferromagnetic metal layer 2 is disrupted.

Due thereto, it is possible to disrupt the y-direction symmetry in the intensity of the supplied spin current, and to create a trigger for causing magnetization reversal.

In this case, the difference in intensity of the spin current is created by spin generated, by spin diffusion, in a portion not overlapping with the magnetoresistance effect element 10 in the z-direction. For this reason, more strictly speaking, it is preferable for the area of a region 21Aa between the first end portion e1 and the third end portion e3 of the spin-orbit torque wiring 20 to be different from the area of a region 21Ba between the second end portion e2 and the fourth end portion e4.

Additionally, although FIG. 6 illustrates a case in which the distance D1 between the first end portion e1 and the third end portion e3 is equal to the distance D2 between the second end portion e2 and the fourth end portion e4, these distances may be different.

As described above, in the spin-orbit torque type magnetization reversal element according to the present embodiment, the area of the spin-orbit torque wiring differs between one end and the other end, on different sides of the axis of the magnetoresistance effect element. For this reason, it is possible to disrupt the y-direction symmetry in the intensity of the supplied spin current, and to create a trigger for causing magnetization reversal. As a result thereof, the magnetization is easily reversed, and magnetization reversal can be performed even in the absence of a magnetic field.

Third Embodiment

Figure 7:
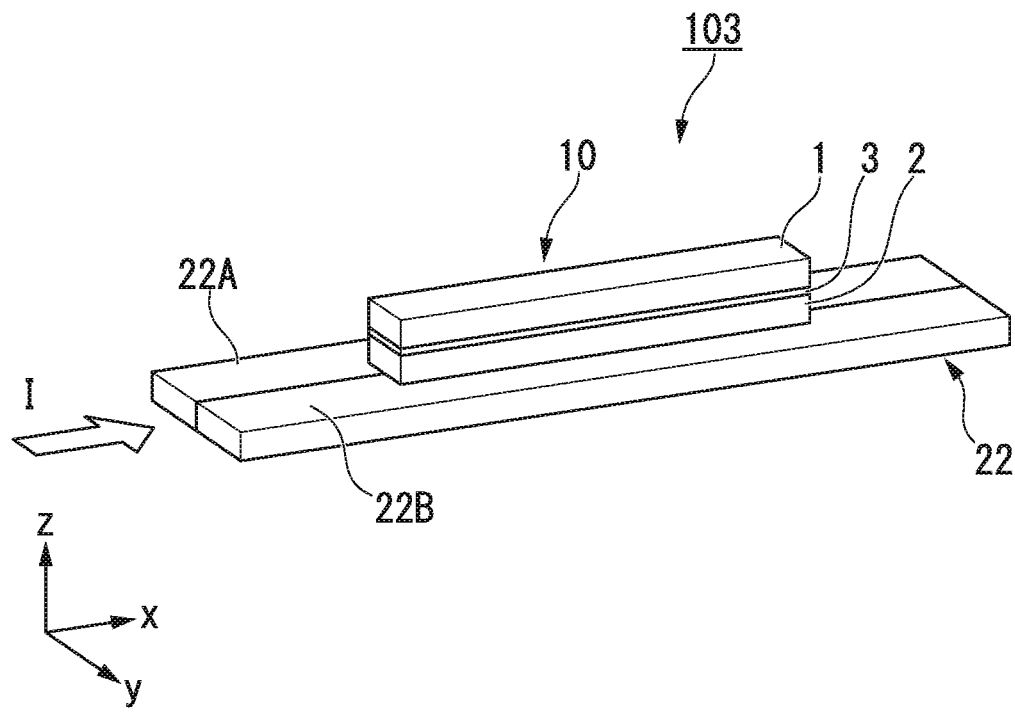
FIG. 7 is a perspective view schematically illustrating a spin-orbit torque type magnetization reversal element according to a third embodiment.

FIG. 7 is a diagram schematically illustrating a spin-orbit torque type magnetization reversal element 103 according to a third embodiment. In the spin-orbit torque type magnetization reversal element 103 illustrated in FIG. 7, the configuration of the spin-orbit torque wiring 22 is different from that in the spin-orbit torque type magnetization reversal element 100 according to the first embodiment. The remaining features are identical to those in the spin-orbit torque type magnetization reversal element 100 according to the first embodiment, and the same features are denoted by the same reference signs.

Figure 8:
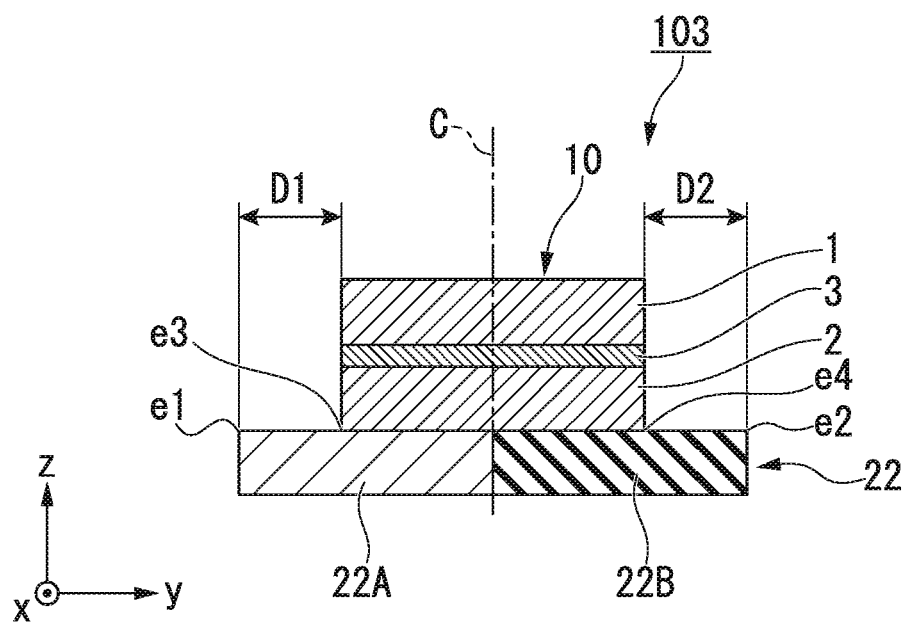
FIG. 8 is a section view of the spin-orbit torque type magnetization reversal element according to the third embodiment, when cut along the y-direction.

FIG. 8 is a schematic section view of the spin-orbit torque type magnetization reversal element 103 according to the third embodiment, when cut along the y-direction. In the spin-orbit torque type magnetization reversal element 103 illustrated in FIG. 8, the distance D1 between the first end portion e1 and the third end portion e3 is equal to the distance D2 between the second end portion e2 and the fourth end portion e4.

On the other hand, as illustrated in FIG. 7 and FIG. 8, in the spin-orbit torque wiring 22, the material constituting a first part 22A that lies towards the first end portion e1 in the y-direction, with respect to the axis C, differs from the material constituting a second part 22B that lies towards the second end portion e2. In this case, "the material constituting the first part 22A differs from the material constituting the second part 22B" does not mean that the portions may not contain the same material. It is sufficient for the first part 22A overall to be at least partially different from the second part 22B overall.

The materials of the spin-orbit torque wiring 20 indicated in the first embodiment may be used in the first part 22A and the second part 22B. By using different materials in the first part 22A and the second part 22B, it is possible to create a difference between the intensity of the spin current generated in the first part 22A and the intensity of the spin current generated in the second part 22B. In other words, the y-direction symmetry can be disrupted.

As the combination between the first part 22A and the second part 22B, it is preferable to use a metal for the first part 22A, and to use a semiconductor or an insulator for the second part 22B. For example, it is possible to use a non-magnetic heavy metal in the first part 22A and to use a topological insulator in the second part 22B.

A metal and a semiconductor or an insulator will differ as to the ease of flow of an electric current. For this reason, if an electric current is supplied in the x-direction, much of the electric current will flow through the first part 22A. In other words, a significant difference can be created between the intensity of the spin current injected from the first part 22A into the second ferromagnetic metal layer 2 and the intensity of the spin current injected from the second part 22B into the second ferromagnetic metal layer 2, and the y-direction symmetry can be disrupted.

Additionally, although FIG. 8 illustrates a case in which the distance D1 between the first end portion e1 and the third end portion e3 is equal to the distance D2 between the second end portion e2 and the fourth end portion e4, these distances may be different.

As described above, in the spin-orbit torque type magnetization reversal element according to the present embodiment, the material constituting the spin-orbit torque wiring differs on different sides of the axis of the magnetoresistance effect element. For this reason, it is possible to disrupt the y-direction symmetry in the intensity of the supplied spin current, and to create a trigger for causing magnetization reversal. As a result thereof, the magnetization is easily reversed, and magnetization reversal can be performed even in the absence of a magnetic field.

Fourth Embodiment

Figure 9:
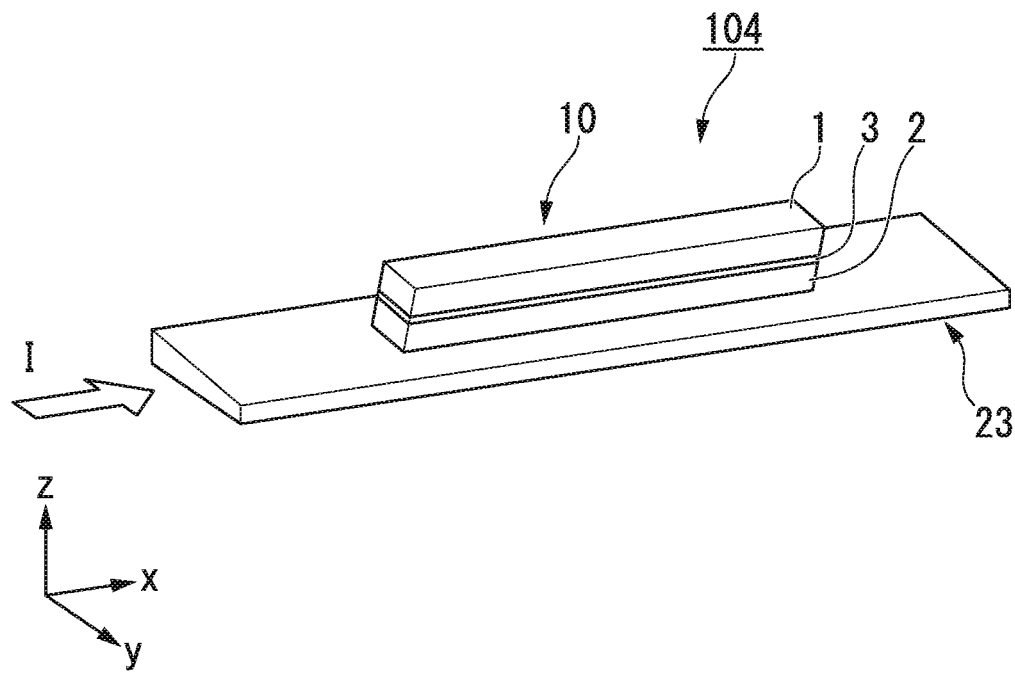
FIG. 9 is a perspective view schematically illustrating a spin-orbit torque type magnetization reversal element according to a fourth embodiment.

FIG. 9 is a diagram schematically illustrating a spin-orbit torque type magnetization reversal element 104 according to a fourth embodiment. In the spin-orbit torque type magnetization reversal element 104 illustrated in FIG. 9, the shape of the spin-orbit torque wiring 23 is different from that in the spin-orbit torque type magnetization reversal element 100 according to the first embodiment. The remaining features are identical to those in the spin-orbit torque type magnetization reversal element 100 according to the first embodiment, and the same features are denoted by the same reference signs.

Figure 10:
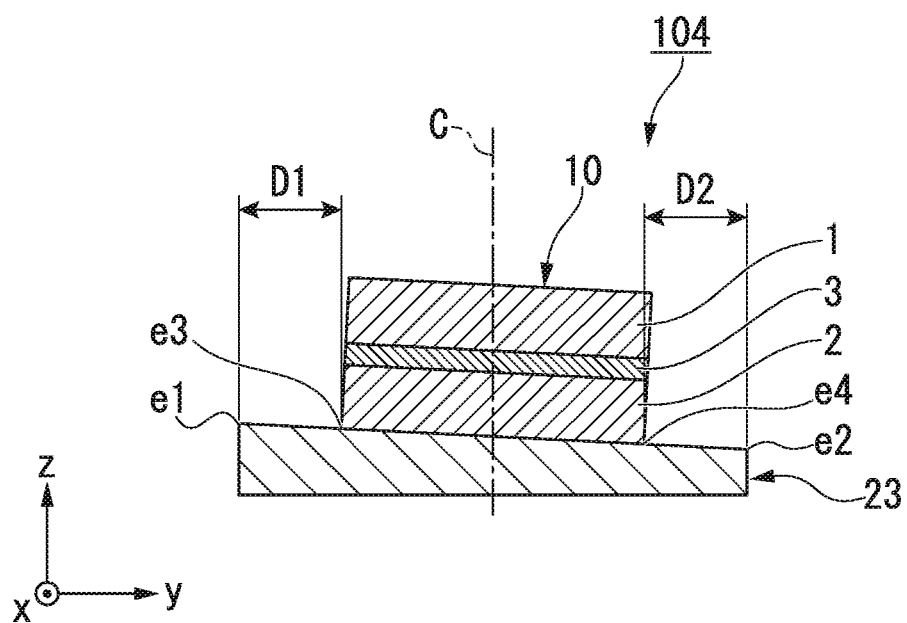
FIG. 10 is a section view of the spin-orbit torque type magnetization reversal element according to the fourth embodiment, when cut along the y-direction.

FIG. 10 is a schematic section view of the spin-orbit torque type magnetization reversal element 104 according to the fourth embodiment, when cut along the y-direction. When the spin-orbit torque type magnetization reversal element 104 illustrated in FIG. 10 is viewed from the x-direction, it is tilted in the y-direction.

For this reason, as illustrated in FIG. 10, in the spin-orbit torque type magnetization reversal element 104 according to the fourth embodiment, the area of the region on the side towards the first end portion e1 in the y-direction, with respect to the axis C, is different from the area of the region on the side towards the second end portion e2. For this reason, it is possible to disrupt the y-direction symmetry in the intensity of the supplied spin current, and to create a trigger for causing magnetization reversal.

Additionally, if the magnetization of the second ferromagnetic metal layer 2 is vertically oriented, then the magnetization of the second ferromagnetic metal layer 2 is vertically oriented with respect to the boundary plane between the second ferromagnetic metal layer 2 and the spin-orbit torque wiring 20. In other words, the orientation of the magnetization is tilted from the z-direction towards the y-direction.

When the magnetization of the second ferromagnetic metal layer 2 that undergoes magnetization reversal itself has a component in the y-direction, it is more easily influenced by the supplied spin current. In other words, the magnetization of the second ferromagnetic metal layer can be more easily reversed.

In the second to fourth embodiments, as in the first embodiment, it is sufficient for there to be a ferromagnetic metal layer, and it is not always necessary for there to be a magnetoresistance effect element 10.

(Method for Producing Spin-Orbit Torque Type Magnetization Reversal Element)

Next, the method for producing the spin-orbit torque type magnetization reversal element will be explained.

A spin-orbit torque type magnetoresistance effect element can be obtained by using a film deposition technique such as sputtering and a shape processing technique such as photolithography.

First, spin-orbit torque wiring is fabricated on a substrate forming a support. The metal constituting the spin-orbit torque wiring is deposited by a generally known film deposition means such as sputtering. Next, a technique such as photolithography is used to process the spin-orbit torque wiring into a predetermined shape.

To obtain a shape as illustrated in FIG. 6, it is possible to incline the end portions by applying resist again to the part that is to form the upper side of the trapezoid, and then etching or the like. Alternatively, the end portions can be inclined by means of a shadow effect by etching at an angle.

Furthermore, portions other than the spin-orbit torque wiring are covered by an insulating film such as an oxide film. The exposed surfaces of the spin-orbit torque wiring and the insulating film should preferably be polished by means of chemical-mechanical polishing (CMP). A shape such as that illustrated in FIG. 10 can be obtained by inclining the polishing surface.

Next, the magnetoresistance effect element is fabricated. The magnetoresistance effect element can be fabricated using a generally known film deposition means such as sputtering. If the magnetoresistance effect element is a TMR element, then a tunnel barrier layer can be formed, for example, by first sputtering approximately 0.4 to 2.0 nm of magnesium, aluminum and a metal thin-film that forms divalent cations with multiple non-magnetic elements onto the second ferromagnetic metal layer, causing plasma oxidation or natural oxidation by feeding oxygen, and thereafter performing a heat treatment. Additionally, a tunnel barrier layer may be formed by using an oxide having a desired composition as the target. The film deposition method may, aside from sputtering, be vapor deposition, laser ablation or MBE.

As the method for forming the magnetoresistance effect element into a predetermined shape, a processing means such as photolithography may be used. First, after stacking the magnetoresistance effect element, a resist is applied to the surface of the magnetoresistance effect element on the side opposite to the spin-orbit torque wiring. Next, the resist is cured at a predetermined part and the unnecessary parts of the resist are removed. The cured part of the resist forms a protective film on the magnetoresistance effect element. The cured part of the resist has the same shape as the magnetoresistance effect element that is finally obtained.

Additionally, the surface on which the protective film is formed is processed by a technique such as ion milling or reactive ion etching (RIE). The part on which the protective film is not formed is removed, resulting in a magnetoresistance effect element of a predetermined shape.

The method for curing the resist in the predetermined shape will be explained in detail.

As a first method, there is a method of sensitizing the resist to light using a mask. For example, a positive resist is used to form a photomask on the part that is to be cured. By exposing the resist to light through the photomask, the resist can be processed to a predetermined shape.

There is a demand for reducing the element size of magnetoresistance effect elements in order to allow higher integration. For this reason, the size of magnetoresistance effect elements may, in some cases, approach the resolution limit that is possible with light exposure. In this case, multiple photomasks that have been processed into rectangular shapes are combined to cure the resist in the predetermined shape. In the current state of the art, one side of one photomask may be made as small as approximately a few nm.

Figure 12:
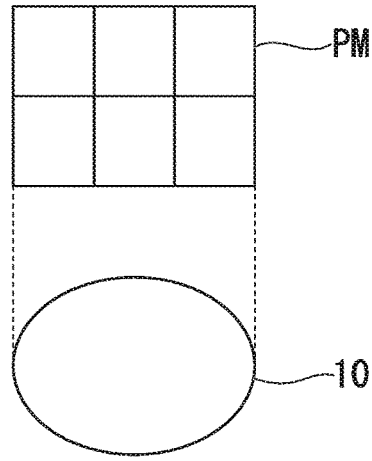
FIG. 12 is a diagram illustrating the correspondence between the shape of a photomask PM and the planar shape of a resulting magnetoresistance effect element 13, when viewed from the z-direction.
Figure 12:
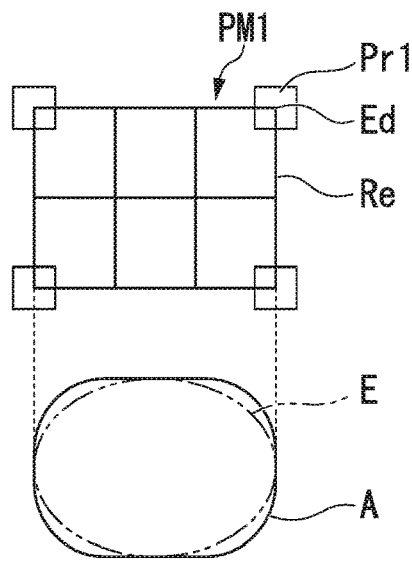
Figure 12:
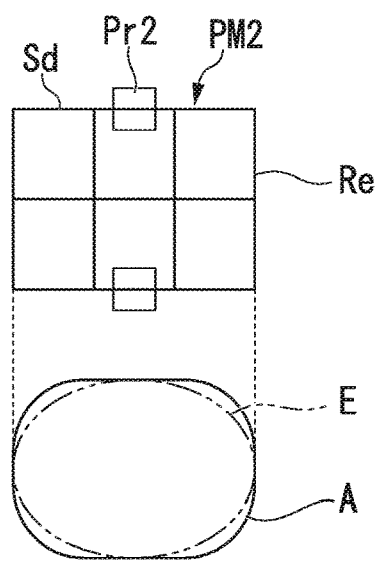

On the other hand, as illustrated in FIG. 12, even if the shape of one photomask PM is rectangular, there are cases in which the planar shape of the magnetoresistance effect element is not faithfully rectangular. FIG. 12 is a diagram illustrating the correspondence between the shape of a photomask and the planar shape of the resulting magnetoresistance effect element, when viewed from the z-direction. As illustrated in FIG. 12(a), even when the shape of one photomask PM is rectangular, the planar shape of the magnetoresistance effect element 10 can become elliptical or the like. This is because some of the light that has passed through the photomask PM is scattered and cures the resist. Additionally, in etching processes such as ion milling, etching proceeds more easily in the parts forming corners.

Additionally, the photomask PM1 illustrated in FIG. 12(b) has a rectangular region Re in which the ellipse can be inscribed, and projecting regions Pr1 at the corners Ed of the rectangular region Re. Additionally, the photomask PM2 illustrated in FIG. 12(c) has a rectangular region Re in which the ellipse can be inscribed, and projecting regions Pr2 on the long sides Sd of the rectangular region Re.

By providing projecting regions Pr1 at the corners Ed as illustrated in FIG. 12(b), it is possible to delay the progress in the etching of the corners Ed during the etching process. Additionally, by providing projecting regions Pr2 on the sides Sd as illustrated in FIG. 12(c), the etching rate difference between the sides Sd and the corners Ed can be made larger during the etching process. By providing a difference in etching rates in this way, it is possible to fabricate a magnetoresistance effect element having an elliptical region E that is inscribed in the planar shape when viewed from the stacking direction, and external regions A positioned to the outside of the elliptical region E.

As another method, spot exposure can be performed by using light having directionality, such as a laser. For example, a negative resist is used, and light is shone only at the parts that are to be cured, thereby processing the resist into a predetermined shape. In this case as well, even if the shape of the spot that is exposed is rectangular, the resulting shape may not be rectangular in some cases.

As mentioned above, even if the shape of the photomask PM is rectangular, the shape of the magnetoresistance effect element may, in some cases, be a shape not having straight edges, such as an ellipse. For this reason, modifications are necessary if the planar shape of the magnetoresistance effect element 10 when viewed from the z-direction is to be made rectangular, as illustrated in FIG. 1.

When the planar shape of the magnetoresistance effect element 10 is to be made rectangular when viewed from the z-direction, the magnetoresistance effect element 10 is processed in two steps. In other words, the process is divided into a first step of processing a stacked body having the first ferromagnetic metal layer, and the non-magnetic layer and the second ferromagnetic metal layer in one direction, and a second step of processing the stacked body, after having been processed in the one direction, in another direction that intersects with the one direction.

Figure 11:
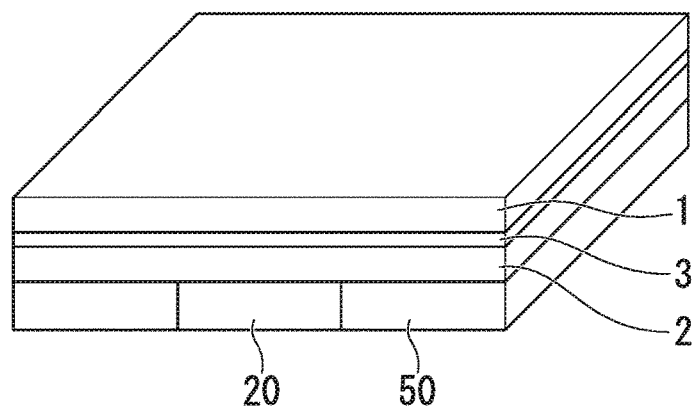
FIG. 11 is a diagram illustrating an example of a spin-orbit torque type magnetization reversal element according to the present embodiment.
Figure 11:
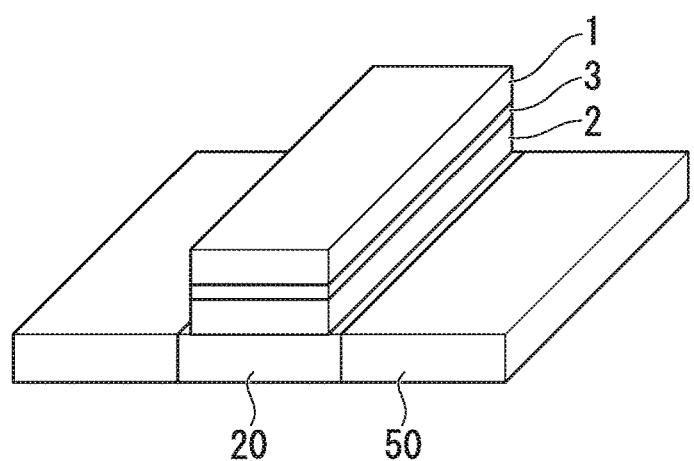
Figure 11:
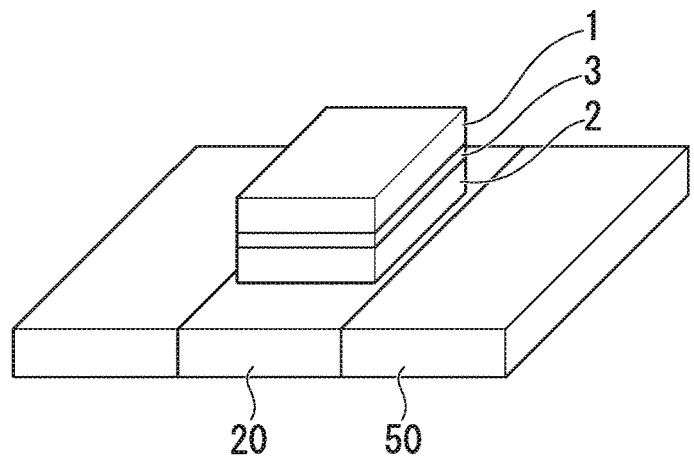

FIG. 11 is a schematic view for explaining the procedure for fabricating a rectangular magnetoresistance effect element. As illustrated in FIG. 11(a), a second ferromagnetic metal layer 2, a non-magnetic layer 3 and a first ferromagnetic metal layer 1 are sequentially stacked onto one surface of spin-orbit torque wiring 20 and an insulator 50, resulting in a stacked body.

Next, the resulting stacked body is processed in one direction. Any direction may be chosen as the one direction. For example, it may be the x-direction in which the spin-orbit torque wiring 20 extends, it may be the y-direction orthogonal to the x-direction, or it may be a direction that is oblique with respect to both the x-direction and the y-direction.

The stacked body may be processed by using a generally known processing means, such as a method using photolithography, or a method using a laser or the like. The stacked body, after processing, has some length in the one direction, and thus can directly reflect the shape of the photomask or the like. In other words, the stacked body can be processed into a straight line in the x-direction.

Next, the resulting stacked body is processed in another direction. Any direction intersecting with the one direction may be chosen as the other direction. In FIG. 11(c), the stacked body is processed in the y-direction that is orthogonal to the x-direction in which the spin-orbit torque wiring 20 extends.

The processing in the other direction may also be performed using a generally known processing means, such as a method using photolithography, or a method using a laser or the like. It is also possible to use a photomask or the like having some length in the other direction when processing the stacked body in the other direction, so the shape of the photomask or the like can thus be directly reflected in the shape after processing. In other words, the stacked body can be processed into a straight line in the y-direction.

Thus, by processing the stacked body in two steps, it is possible to make the planar shape of the magnetoresistance effect element 10 rectangular when viewed from the z-direction.

Additionally, the outer surface of the resulting magnetoresistance effect element 10 may be covered by an insulator. The insulator may be a generally known insulator such as an oxide film, a nitride film or the like.

The present invention is not necessarily limited to the structures and the production methods of the spin-orbit torque type magnetization reversal elements according to the above-mentioned embodiments, and various modifications may be added within a range not departing from the spirit of the present invention.

REFERENCE SIGNS LIST

1 First ferromagnetic metal layer
2 Second ferromagnetic metal layer
3 Non-magnetic layer
10 Magnetoresistance effect element
20, 21, 22, 23 Spin-orbit torque wiring
50 Insulator
100, 101, 102, 103, 104 Spin-orbit torque type magnetization reversal element
e1 First end portion
e2 Second end portion
e3 Third end portion
e4 Fourth end portion
S1 First spin
S2 Second spin
I Electric current
Js Pure spin current

What is claimed is:

1. A spin-orbit torque type magnetization reversal element comprising:
   a ferromagnetic metal layer with a varying magnetization direction; and
   spin-orbit torque wiring that extends in a first direction intersecting with a stacking direction of the ferromagnetic metal layer and that is joined to the ferromagnetic metal layer; wherein
   when end portions of the spin-orbit torque wiring in a second direction that is orthogonal to the first direction and the stacking direction are defined as a first end portion and a second end portion; and of the end portions of the ferromagnetic metal layer in the second direction, the end portion on a side closer to the first end portion is defined as a third end portion and the end portion on a side closer to the second end portion is defined as a fourth end portion,
   an area of a region of the spin-orbit torque wiring between the first end portion and the third end portion differs from an area of a region of the spin-orbit torque wiring between the second end portion and the fourth end portion in a cross section in a direction perpendicular to the first direction as viewed from the first direction, and the spin-orbit torque wiring is configured to reverse the magnetization of the ferromagnetic metal layer by inducing spin orbit torque in the ferromagnetic metal layer.

2. The spin-orbit torque type magnetization reversal element according to claim 1, wherein an inclination angle of an end surface of the spin-orbit torque wiring from the first end portion toward the third end portion differs from an inclination angle of an end surface of the spin-orbit torque wiring from the second end portion toward the fourth end portion in a cross section in a direction perpendicular to the first direction as viewed from the first direction, and the spin-orbit torque wiring is configured to reverse the magnetization of the ferromagnetic metal layer by inducing spin orbit torque in the ferromagnetic metal layer.

3. The spin-orbit torque type magnetization reversal element according to claim 1, wherein:

a distance between the first end portion and the third end portion is different from a distance between the second end portion and the fourth end portion.

4. The spin-orbit torque type magnetization reversal element according to claim 3, wherein the distance between the first end portion and the third end portion and the distance between the second end portion and the fourth end portion are both greater than zero, and at least one of the distances is not more than a spin diffusion length of the spin-orbit torque wiring.

5. The spin-orbit torque type magnetization reversal element according to claim 1, wherein, when the spin-orbit torque wiring is viewed from the first direction, an area of a first region lying on a side towards a first end portion in the second direction, with respect to an axis, is different from an area of a second region lying on a side towards a second end portion, and the axis is a straight line that passes through a center, in the second direction, of the ferromagnetic metal layer and extends in the stacking direction of the ferromagnetic metal layer.

6. The spin-orbit torque type magnetization reversal element according to claim 1, wherein, in the spin-orbit torque wiring, a material constituting a first part on a side towards a first end portion in the second direction, with respect to an axis, is different from a material constituting a second part lying on a side towards a second end portion, and the axis is a straight line that passes through a center, in the second direction, of the ferromagnetic metal layer and extends in the stacking direction of the ferromagnetic metal layer.

7. The spin-orbit torque type magnetization reversal element according to claim 6, wherein the first part comprises a metal, and the second part comprises a semiconductor or an insulator.

8. The spin-orbit torque type magnetization reversal element according to claim 1, wherein the spin-orbit torque wiring is inclined in the second direction when viewed from the first direction.

9. The spin-orbit torque type magnetization reversal element according to claim 1, further comprising a non-magnetic layer and a fixed layer with a fixed magnetization direction, on a surface on a side of the ferromagnetic metal layer opposite to the spin-orbit torque wiring.

10. A magnetic memory using the spin-orbit torque type magnetization reversal element according to claim 9.

11. A high-frequency magnetic device using the spin-orbit torque type magnetization reversal element according to claim 9.

12. A spin-orbit torque type magnetization reversal element comprising:

a ferromagnetic metal layer with a varying magnetization direction; and spin-orbit torque wiring that extends in a first direction intersecting with a stacking direction of the ferromagnetic metal layer and that is joined to the ferromagnetic metal layer; wherein when end portions of the spin-orbit torque wiring in a second direction that is orthogonal to the first direction and the stacking direction are defined as a first end portion and a second end portion; and of the end portions of the ferromagnetic metal layer in the second direction, the end portion on a side closer to the first end portion is defined as a third end portion and the end portion on a side closer to the second end portion is defined as a fourth end portion, an inclination angle of an end surface of the spin-orbit torque wiring from the first end portion toward the third end portion differs from an inclination angle of an end surface of the spin-orbit torque wiring from the second end portion toward the fourth end portion in a cross section in a direction perpendicular to the first direction as viewed from the first direction, and the spin-orbit torque wiring is configured to reverse the magnetization of the ferromagnetic metal layer by inducing spin orbit torque in the ferromagnetic metal layer.

13. The spin-orbit torque type magnetization reversal element according to claim 12, wherein:

a distance between the first end portion and the third end portion is different from a distance between the second end portion and the fourth end portion.

14. The spin-orbit torque type magnetization reversal element according to claim 13, wherein the distance between the first end portion and the third end portion and the distance between the second end portion and the fourth end portion are both greater than zero, and at least one of the distances is not more than a spin diffusion length of the spin-orbit torque wiring.

15. The spin-orbit torque type magnetization reversal element according to claim 12, wherein, when the spin-orbit torque wiring is viewed from the first direction, an area of a first region lying on a side towards a first end portion in the second direction, with respect to an axis, is different from an area of a second region lying on a side towards a second end portion, and the axis is a straight line that passes through a center, in the second direction, of the ferromagnetic metal layer and extends in the stacking direction of the ferromagnetic metal layer.

16. The spin-orbit torque type magnetization reversal element according to claim 12, wherein, in the spin-orbit torque wiring, a material constituting a first part on a side towards a first end portion in the second direction, with respect to an axis, is different from a material constituting a second part lying on a side towards a second end portion, and the axis is a straight line that passes through a center, in the second direction, of the ferromagnetic metal layer and extends in the stacking direction of the ferromagnetic metal layer.

17. The spin-orbit torque type magnetization reversal element according to claim 16, wherein
the first part comprises a metal, and the second part comprises a semiconductor or an insulator.

18. The spin-orbit torque type magnetization reversal element according to claim 12, wherein
the spin-orbit torque wiring is inclined in the second direction when viewed from the first direction.

19. The spin-orbit torque type magnetization reversal element according to claim 12, further comprising a non-magnetic layer and a fixed layer with a fixed magnetization direction, on a surface on a side of the ferromagnetic metal layer opposite to the spin-orbit torque wiring.

20. A magnetic memory using the spin-orbit torque type magnetization reversal element according to claim 19.

21. A high-frequency magnetic device using the spin-orbit torque type magnetization reversal element according to claim 19.

* * * * *